US006181741B1

(12) United States Patent
Nakanishi

(10) Patent No.: US 6,181,741 B1
(45) Date of Patent: Jan. 30, 2001

(54) REMOTE CONTROL RECEIVER

(75) Inventor: Yutaka Nakanishi, Tokyo (JP)

(73) Assignee: Optec Co., Ltd., Tokyo (JP)

(*) Notice: Under 35 U.S.C. 154(b), the term of this patent shall be extended for 0 days.

(21) Appl. No.: 09/102,086

(22) Filed: Jun. 22, 1998

(30) Foreign Application Priority Data

Jun. 27, 1997 (JP) ........................................ 9-172542

(51) Int. Cl.[7] ........................ H03K 7/08; H03K 9/08

(52) U.S. Cl. .................... 375/238; 375/239; 375/342; 375/360; 375/368; 370/205

(58) Field of Search .............................. 375/340, 342, 375/360, 362, 364, 365, 368, 238, 239; 370/205, 508, 519

(56) References Cited

U.S. PATENT DOCUMENTS

| | | | | |
|---|---|---|---|---|
| 5,436,853 | * | 7/1995 | Shimohara | 364/569 |
| 5,506,715 | * | 4/1996 | Zhu | 359/147 |
| 5,570,393 | * | 10/1996 | Kho | 375/333 |
| 5,621,758 | * | 4/1997 | Suzuki et al. | 375/238 |
| 5,856,979 | * | 1/1999 | Vogel et al. | 370/503 |
| 5,898,513 | * | 4/1999 | Gist et al. | 359/189 |
| 5,959,980 | * | 9/1999 | Scott | 370/280 |
| 6,038,255 | * | 3/2000 | Palmer et al. | 375/238 |

FOREIGN PATENT DOCUMENTS

| | | |
|---|---|---|
| 0 525 667 | 2/1993 | (EP) . |
| 2 270 601 | 3/1994 | (GB) . |
| PCT/IB94/ 00329 | 10/1994 | (WO) . |

* cited by examiner

*Primary Examiner*—Stephen Chin
*Assistant Examiner*—Dac V. Ha
(74) *Attorney, Agent, or Firm*—Nixon Peabody LLP; David S. Safran

(57) ABSTRACT

The back end position of a pulse, which is transmitted from a remote control, varies according to the transmission distance, and the pulse width changes. A remote control receiver of the present invention detects the pulse width of a header, which is formed at the head of each frame in a remote control signal from the remote control, so as to detect the transmission distance of the remote control signal and a change in back end position of each pulse in a data part, which is transmitted after the header. Then, the back end position of each pulse is corrected to original. This eliminates the change in pulse width resulting from a change in transmission distance, and increases the allowable range of the transmission distance of the remote control.

2 Claims, 8 Drawing Sheets

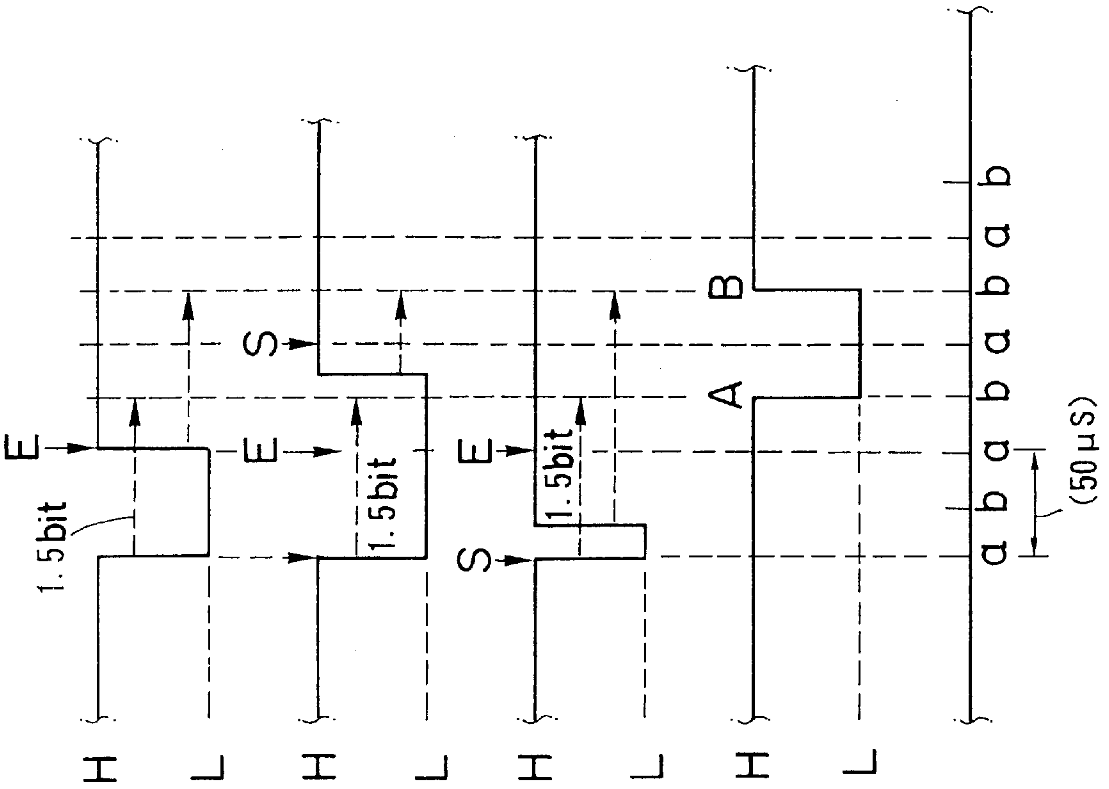
FIG. 6(A) INTERMEDIATE DISTANCE
FIG. 6(B) SHORT DISTANCE
FIG. 6(C) LONG DISTANCE
FIG. 6(D) AFTER WAVEFORM SHAPING
FIG. 6(E) CLOCK

REMOTE CONTROL RECEIVER

BACKGROUND OF THE INVENTION

1. Field of the Invention

The present invention relates generally to a remote control receiver which receives a remote control signal from a remote control which is used in a game machine, etc.

2. Description of Related Art

In a conventional game machine, a game machine body receives signals from a remote control on radio waves or infrared rays. It is convenient because a person can operate the remote control anywhere from the body of the game machine.

The above-mentioned remote control generates a remote control signal by serially arranging data in a plurality of bits, one-bit data being defined by the presence of a pulse with predetermined width. A transmitted waveform defines a pulse with use of a carrier. For instance, when the carrier is transmitted, the pulse is defined as a low level (L-level), and when the carrier is not transmitted, the pulse is defined as a high level (H-level). At the receiving side, the pulse is defined as the L-level or the H-level in the same manner.

The distance between the game machine body and the remote control varies in the transmission of the data from the remote control to the game machine body. The intensity of the signal, which the game machine body receives, varies according to the distance. For this reason, there is a disadvantage in that the data cannot be read correctly since a received waveform in the game machine body varies according to the transmission distance.

Specifically, if the remote control is close to the game machine body, or if the transmission distance is short, the pulse width of a received signal, which is reproduced by the game machine body, is larger than the pulse width of a transmitted signal, which is output from the remote control. If the remote control is far from the game machine body, or if the transmission distance is long, the pulse width of a received signal, which is reproduced by the game machine body, is smaller than the pulse width of a transmitted signal from the remote control.

The pulse width of the transmitted signal, which is output from an ordinarily remote control, is between 500 $\mu s$ and 600 $\mu s$. No trouble occurs in the reception if the pulse width changes only within the range of between ±200 $\mu s$ and ±250 $\mu s$. In the case of a high-speed communication which transmits the data ten times faster than a conventional communication, a change in pulse width must be within the range of ±20 $\mu s$.

Since the pulse width of the transmitted signal varies according to the transmission distance as stated above, the remote control can only be used within the transmission distance of between 1 m and 2.5 m in the high-speed communication wherein the change in pulse width is restricted within the range of ±20 $\mu s$, compared with an ordinary communication wherein the remote control which can be used within the transmission distance of between 0.2 m and 8 m. For this reason, the remote control is not practical.

SUMMARY OF THE INVENTION

The present invention has been developed in view of the above-described circumstances, and has as its object the provision of a remote control receiver which puts a remote control system, which transmits and receives a remote control signal in the high-speed communication, into practical use.

To achieve the above-mentioned object, the present invention is directed to the remote control receiver which comprises: a receiver which receives a remote control signal in which one frame is composed of a header representing a value "1", a part with no signal representing a value "0", and a data part with a plurality of bits representing a value "1" or "0"; a detector which detects the length of the header in each frame of the remote control signal received by the receiver; a waveform shaper for delaying a point where the remote control signal rises from "0" to "1" by a preset time, and delaying a point where the remote control signal falls from "1" to "0" to a point where the remote control signal would rise normally in accordance with the length of the header detected by the detector; and wherein the remote control signal is made a uniform length.

According to the present invention, the detection of the length of the header in the remote control signal results in the detection of a change in a point where the remote control signal falls from "1" to "0", the point changing according to the transmission distance. The rising point of the remote control signal from "0" to "1" is delayed by a predetermined period of time, and the point where the remote control signal falls from "1" to "0" is delayed to the point where the remote control signal would fall normally in accordance with the length of the header.

This makes the remote control signals a uniform length, and corrects the data of each bit so that the data can have a proper width, regardless of the transmission distance of the remote control signal.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 6(A), 6(B), 6(C), 6(D), and 6(E) are views of assistance in explaining the processing in the waveform shaping;

DETAILED DESCRIPTION OF THE PREFERRED EMBODIMENT

This invention will be described in further detail by way of example with reference to the accompanying drawings.

Figure 1:
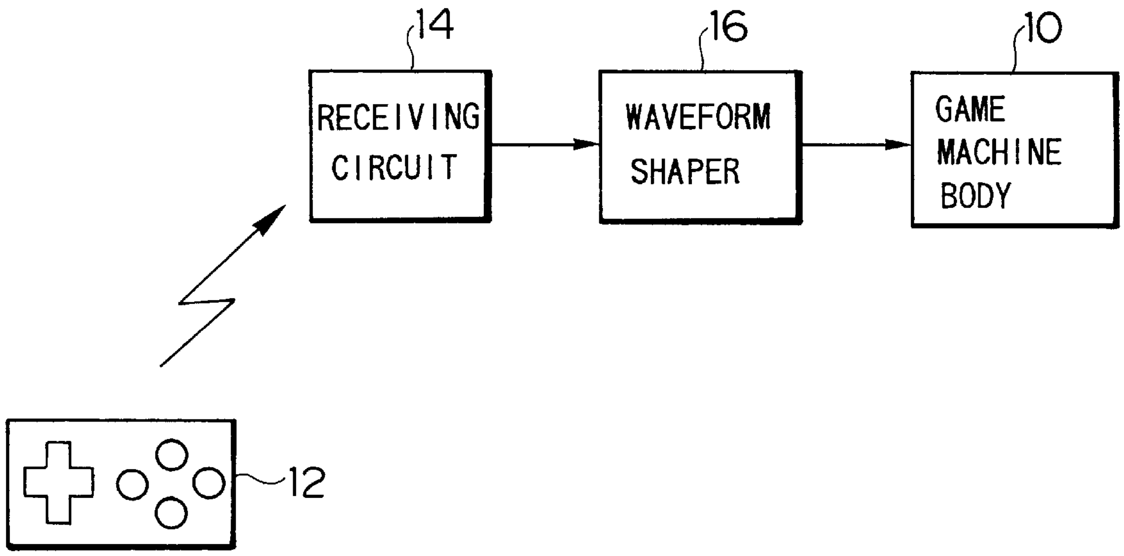
FIG. 1 is a view illustrating the entire structure of a game machine which uses a remote control receiver according to the present invention.

FIG. 1 shows the entire structure of a game machine which uses a remote control receiver according to the present invention. The game machine in FIG. 1 consists of a game machine body 10, a remote control 12, a receiving circuit 14, and a waveform shaper 16.

The game machine body executes a game program, and receives a control signal to proceed a game on a screen such as a TV monitor. The remote control 12 transmits the control signal to the receiving circuit 14 on radio waves (or infrared rays) in response to the user's operation of buttons, etc.

Figure 2:
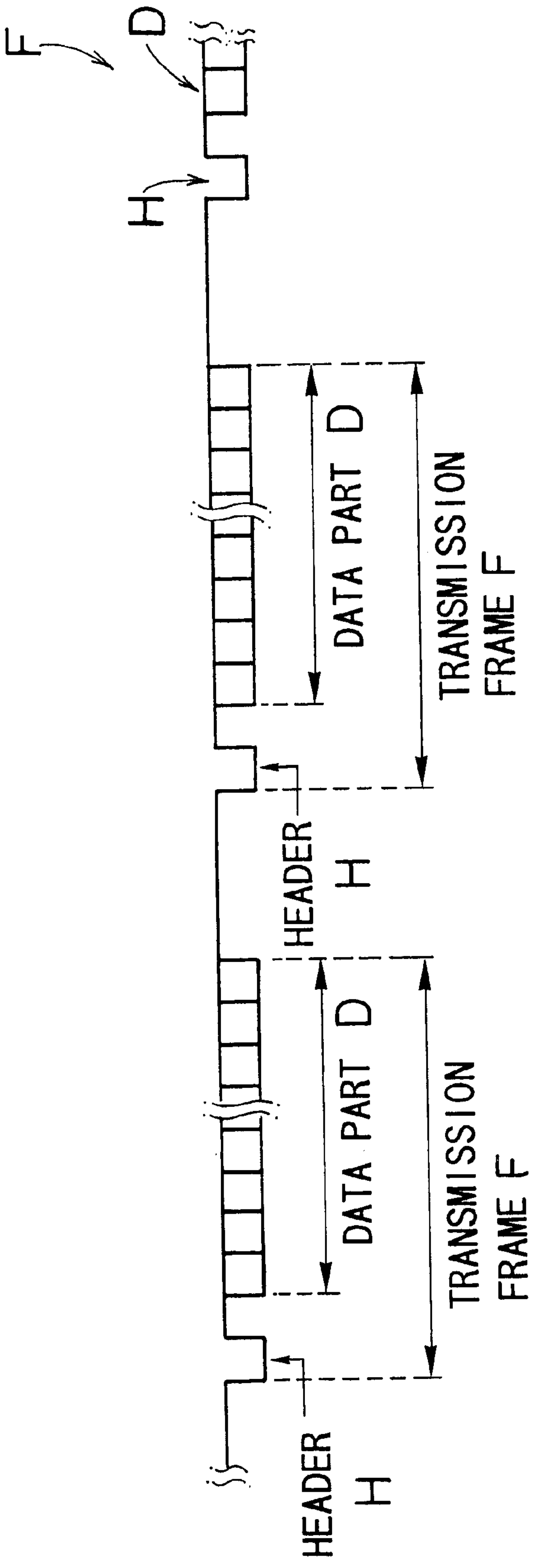
FIG. 2 is a view illustrating the structure of a control signal which is transmitted from a remote control.

FIG. 2 shows the structure of the control signal which is transmitted from the remote control 12. As shown in FIG. 2, the control signal is constructed by transmission frames F with predetermined length. A header H (a pulse of 1 bit (50 μs) at L level) is formed at the head of each transmission frame F. After the transmission of the header H, a data part D is formed via one bit with no signal. The data part D is composed of data in plurality of bits, and the data of each bit are indicated by pulses at H level and L level.

The remote control 12 transmits the control signal by high-speed communication, and each bit is 50 μs long. The presence of the carrier determines whether the control signal, which is transmitted from the remote control 12, is H-level or L-level. The control signal is L-level when the remote control 12 transmits the carrier, and the control signal is H-level when the remote control 12 does not transmit the carrier.

The receiving circuit 14 detects the control signal, which is transmitted on the infrared rays from the remote control 12, by means of a photodiode, and abstracts a frequency component of the carrier with support of a resonant circuit through an amplifier. The receiving circuit 14 generates the control signal composed of the H-level and L-level pulses in accordance with the presence of the carrier, and inputs the control signal to the waveform shaper 16.

Figure 3:
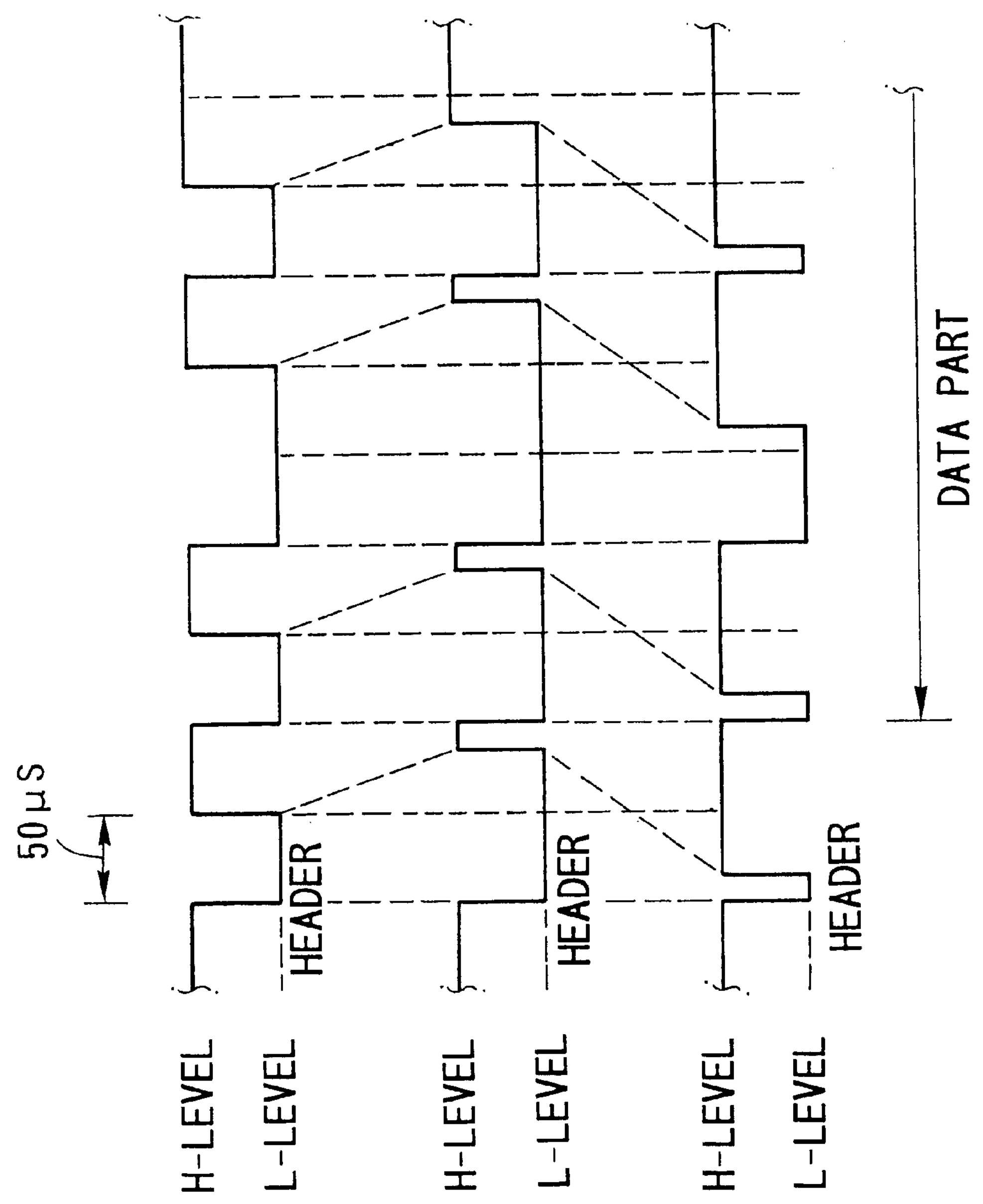
FIGS. 3(A), 3(B), and 3(C) are views illustrating received waveforms which vary according to the transmission distance.

FIGS. 3(A), 3(B) and 3(C) show a part of a received waveform of the control signal, which is detected by the receiving circuit 14, when the remote control 12 transmits the control signal with changes in the distance between the remote control 12 and the receiving circuit 14 (the transmission distance).

FIG. 3(A) shows a received waveform in which a transmitted waveform is reproduced faithfully when the transmission distance is intermediate. The received waveform is reproduced in substantially the same form as the transmitted waveform.

FIG. 3(B) shows the case where the transmission distance is shorter than the intermediate distance. Compared to FIG. 3(A), the rising position of the L-level pulse of the received waveform is behind a position which would be observed (rise) normally. The width of the L-level pulse is larger than that of the L-level pulse of the transmitted waveform. In other words, due to the high intensity of the transmitted signal detected by the photodiode when the transmission distance is short, the resonant circuit resonates strongly to enlarge the pulse width.

FIG. 3(C) shows the case where the transmission distance is long, in other words, the transmission distance is longer than the intermediate distance. In this case, the rising position of the L-level pulse of the received waveform is ahead of a position which would be observed normally, and the L-level pulse width is smaller than the L-level pulse width of the transmitted waveform. In other words, if the transmission distance is long, the resonant circuit resonates weakly to reduce the pulse width due to the low intensity of the transmitted signal detected by the photodiode.

As shown in FIGS. 3(A), 3(B) and 3(C), the rising position of the L-level pulse of the received waveform is substantially constant in a positional relationship with respect to the falling position of the header regardless of the transmission distance.

The waveform shaper 16 shapes the received waveform so that the pulse width thereof, which changes according to the transmission distance, can be proper.

Figure 4:
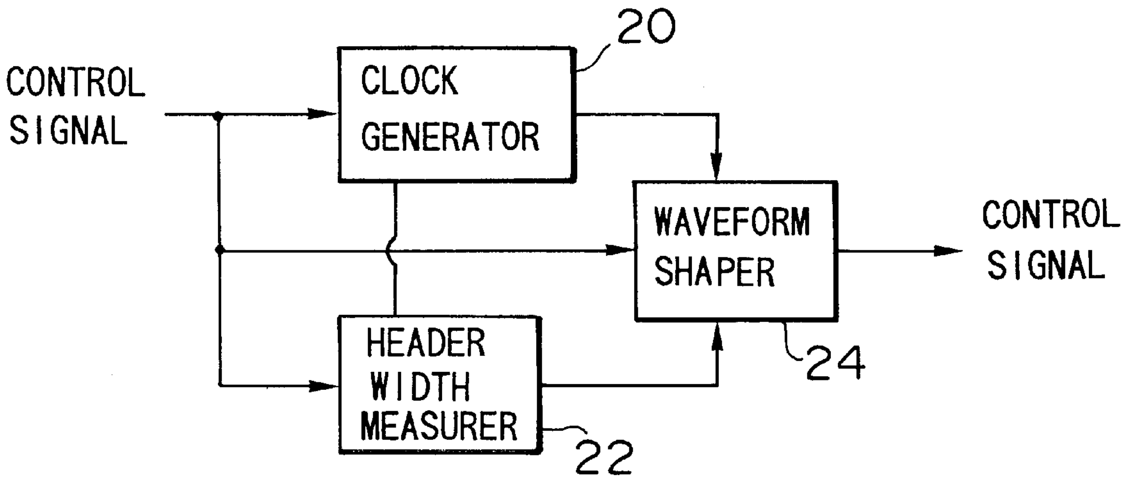
FIG. 4 is a block diagram illustrating a waveform shaper.

FIG. 4 is a block diagram illustrating the structure of the waveform shaper 16. As shown in FIG. 4, the waveform shaper 16 is comprised mainly of a clock generating circuit 20, a header width measurement circuit 22, and a waveform shaping circuit 24. The control signal output from the receiving circuit 14 (see FIG. 1) is input to the clock generator 20, the header width measurement circuit 22 and the waveform shaping circuit 24 through an input terminal of the waveform shaper 16.

On reception of the header of each transmission frame in the control signal, the clock generator generates a clock with a preset frequency in synchronism with the fall of the header and inputs the clock to the waveform shaping circuit 24. At 35 μs and 65 μs after the header falls, the clock generator 20 generates a timing signal, and inputs it to the header width measurement circuit 22.

Figures 5A, 5B, 5C, 5D:
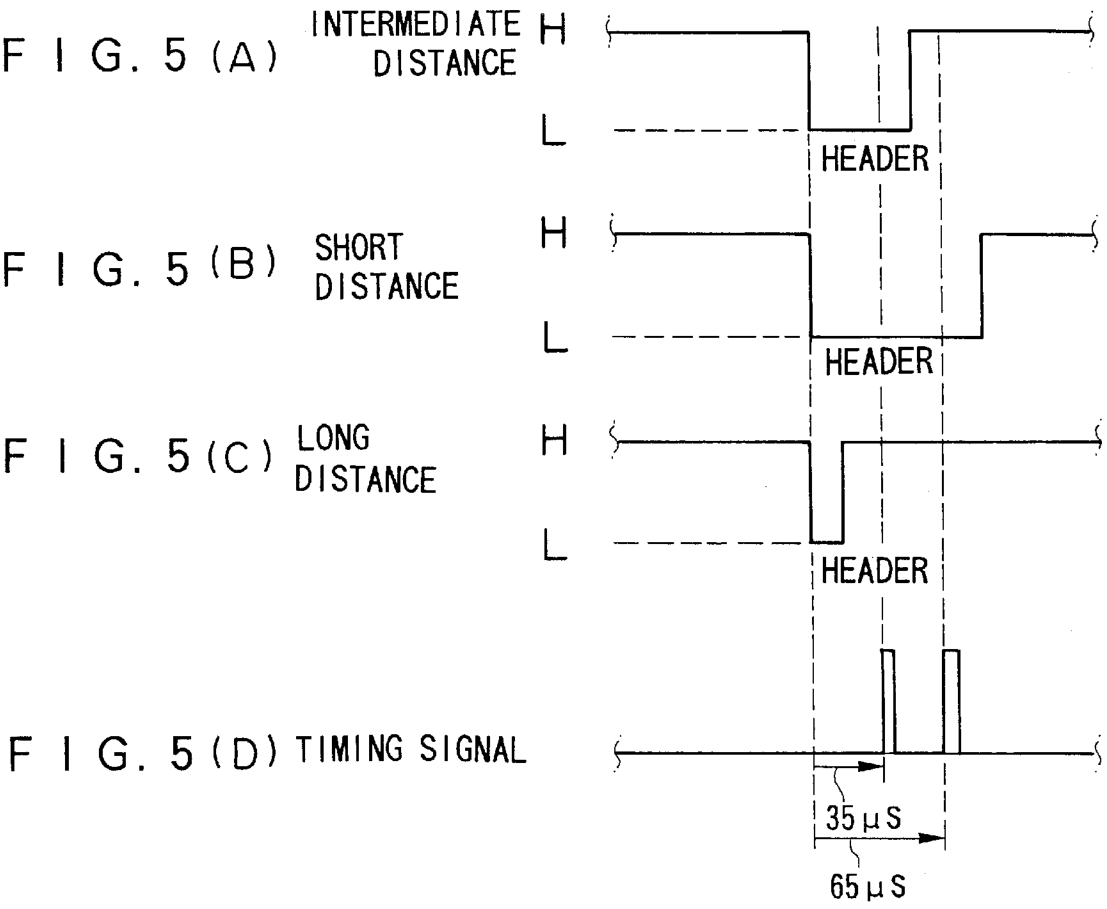
FIGS. 5(A), 5(B), 5(C) and 5(D) are views of assistance in explaining the operation of a header width measurement circuit.

On reception of each transmission frame in the control signal, the header width measuring circuit 22 sorts out the transmission distance into the following three distances: the intermediate, short and long distances. Specifically, on reception of the timing signal from the clock generator 20 at 35 μs after the header falls as shown in FIG. 5(D), the header width measuring circuit 22 determines whether the waveform (the received waveform) of the control signal is L-level or H-level. If H-level, the transmission distance is determined as being long since the pulse width of the header is 35 μs or less as shown in FIG. 3(C), which is much smaller than the pulse width 50 μs of the header in the transmitted waveform.

On the other hand, on reception of the timing signal from the clock generator 20 at 65 μs after the header falls if the waveform is L-level (see FIG. 5(D)), the header width measuring circuit 22 determines whether the received waveform is L-level or H-level. If H-level, the transmission distance is determined as being intermediate since the pulse width of the header is between 35 μs and 50 μs as shown in FIG. 5(A), and thus the pulse width of the header is substantially equal to the pulse width of the transmitted waveform. If L-level, the transmission distance is determined as being short since the pulse width of the header is 65 μs or more as shown in FIG. 5(B), which is much larger than the pulse width 50 μs of the header in the transmitted waveform.

After the transmission distance is determined as being intermediate, short or long in accordance with the pulse width of the header at each transmission frame in the above-mentioned manner, the waveform shaper 24 receives the result.

On input of each transmission frame in the control signal, the waveform shaping circuit 24 receives the sort of the transmission distance from the header width measurement circuit 22, and executes a processing in accordance with the classification of the transmission distance as described below. FIG. 6 is a view of assistance in explaining the processing.

On input of the data part in the transmission frame F, the waveform shaping circuit 24 detects the rise and fall of the L-level pulse. When the waveform shaping circuit 24 detects the fall of the pulse, it delays the falling position by 1.5 bit in accordance with clocks a and b which are input every 1.5 bit from the clock generator 20 (see FIG. 6(E)). This delays the falling position to a position A shown in FIG. 6(D).

On the other hand, when the waveform shaping circuit 24 detects the rise of the pulse, the waveform shaping circuit 24 detects a position where the pulse would rise normally in accordance with the sort of the transmission distance. Then, the rising position is delayed by 1.5 bit from the position where the pulse would rise normally.

If the waveform shaping circuit 24 detects the rise of the L-level pulse within the range of ±25 μs with respect to an ending position E of a predetermined bit as shown in FIG. 6(A) when the transmission distance is intermediate, the ending position E is defined as a position where the pulse would rise normally. Then, the rising position of the pulse is delayed by 1.5 bit from the ending position E of the bit. This delays the rising position to a position B shown in FIG. 6(D), and correctly shapes the pulse width to 50 μs.

If the waveform shaping circuit 24 detects the rise of the pulse in 50 μs (an ending position S of the next bit) from an ending position E of a predetermined bit when the transmission distance is short, the ending position E of the bit is defined as a position where the pulse would rise normally. The rising position of the pulse is delayed 1.5 bit from the ending position E of the bit. This delays the rising position to the position B shown in FIG. 6(D), and correctly shapes the pulse width to 50 μs.

If the waveform shaping circuit 24 detects the rise of the pulse between a starting position S of a predetermined bit and an ending position E of the bit as shown in FIG. 6(C) when the transmission distance is long, the ending position E of the bit is defined as a position where the pulse would rise normally. Then, the rising position of the pulse is delayed 1.5 bit from the ending position E of the bit. This delays the rising position to the position B shown in FIG. 6(D), and correctly shapes the pulse width to 50 μs.

As a result of the above-described processing, the pulse width of the received waveform is corrected to normal. This correction enlarges the conventional allowable pulse width from ±20 μs to nearly ±50 μs, and hence the allowable transmission distance is between approximately 0.8 m and 6 m. The data can be read accurately within the range.

Since the waveform shaping circuit needs the delay of 1.5 bit to shape the waveform, the delay is added to a receiving time for one frame with predetermined length, and the waveform shaping of one frame is completed. Then, the waveform shaping circuit enters a waiting mode to wait for the input of the header in the next frame.

The waveform shaping circuit 24 shapes the waveform of the control signal, and outputs the control signal. The control signal is input to a control signal input terminal of the game machine body 10 at the rear of the waveform shaper 24.

Figure 7:
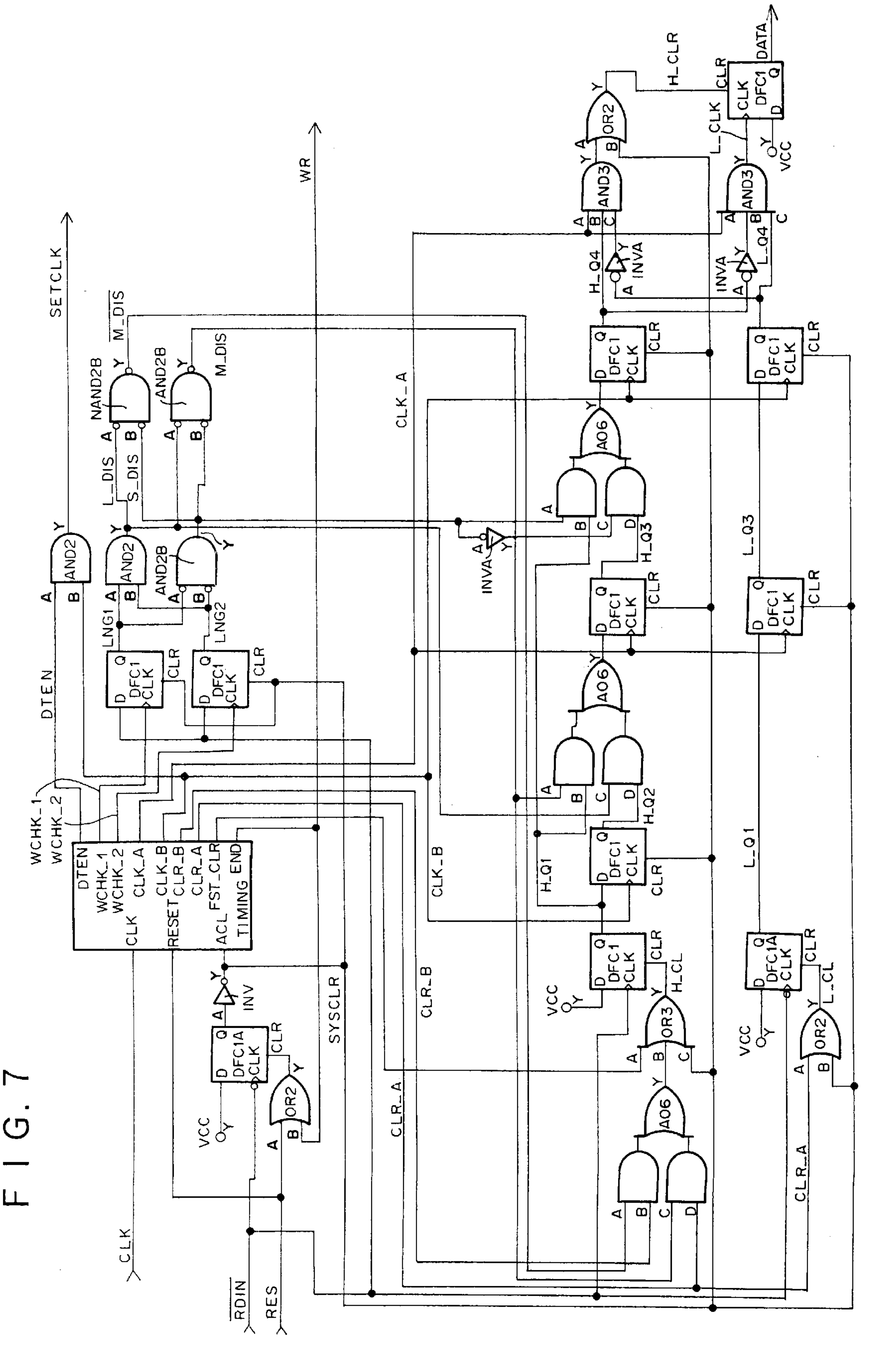
FIG. 7 is a circuit diagram which constructs the waveform shaper.
Figure 8:
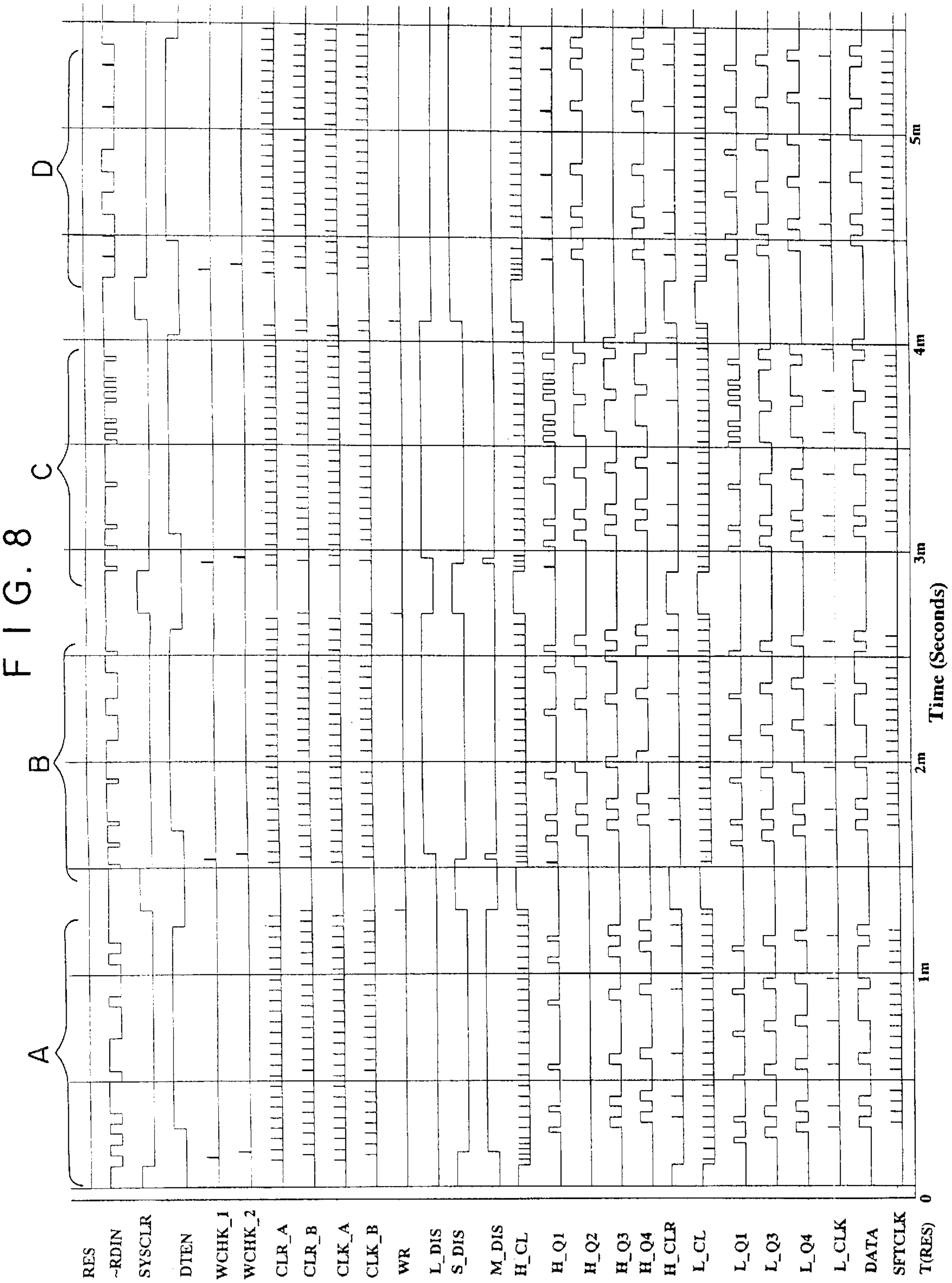
FIG. 8 is a timing chart describing a waveform at each point in the circuit diagram of FIG. 7.

FIG. 7 is a circuit diagram which constructs the waveform shaper, and FIG. 8 is a timing chart showing the waveform at each point in the circuit diagram. In the timing chart of FIG. 8, the waveforms A, B, C and D at a point "RDIN" represent the received waveforms when the transmission distance is intermediate, long, long and short, respectively. The output waveforms (waveforms after the waveform shaping) are represented at a point "DATA."

As set forth hereinabove, according to the present invention, the detection of the length of the header in the remote control signal results in the detection of a change in the point where the remote control signal falls from "1" to "0", the point changing according to the transmission distance. The point where the remote control signal rises from "0" to "1" is delayed by a predetermined time, and the point where the remote control signal falls from "1" to "0" is delayed to the point where the remote control signal would fall normally in accordance with the length of the header. This makes the remote control signals a uniform length regardless of the transmission distance of the remote control signal, and corrects the data of each bit so that it can have a proper width.

This enlarges the allowable width of the pulse representing "1" of each bit of the remote control signal to nearly the bit width. For instance, since the allowable width of the pulse is approximately ±50 μs in the case of the high-speed communication in which the bit width is ±50 μs, the allowable range of the transmission distance is increased, so that the remote control can be used over a large area.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A remote control receiver comprising:

a receiver which receives a remote control signal in which one frame is composed of a header representing a value "1", a part with no signal representing a value "0", and a data part with a plurality of bits representing a value "1" or "0";

a detector which detects the length of the header in each frame of said remote control signal received by said receiver;

a waveform shaper for delaying a point where said remote control signal rises from "0" to "1" by a preset time, and delaying a point where said remote control signal falls from "1" to "0"to a point where said remote control signal would rise normally in accordance with the length of the header detected by said detector;

wherein said remote control signal is made a uniform length; and wherein said detector detects the length of the headers and sorts the detected length into three, and said waveform shaper adjusts a time for delaying a point where said remote control signal falls from "1" to "0" in accordance with the sort of the detected length.

2. The remote control receiver as defined in claim 1, wherein the length of said header varies according to the distance between a transmitter which transmits said remote control signal and said receiver which receives said remote control signal.

* * * * *